(12) United States Patent
Yang et al.

(10) Patent No.: US 9,209,073 B2
(45) Date of Patent: Dec. 8, 2015

(54) METAL CAP APPARATUS AND METHOD

(71) Applicant: Taiwan Semiconductor Manufacturing Company, Ltd., Hsin-Chu (TW)

(72) Inventors: Liang-Yueh Ou Yang, New Taipei (TW); Chih-Yi Chang, New Taipei (TW); Chen-Yuan Kao, Zhudong Township (TW); Hung-Wen Su, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 93 days.

(21) Appl. No.: 13/849,608

(22) Filed: Mar. 25, 2013

(65) Prior Publication Data

US 2014/0264920 A1    Sep. 18, 2014

Related U.S. Application Data

(60) Provisional application No. 61/778,307, filed on Mar. 12, 2013.

(51) Int. Cl.
*H01L 23/48* (2006.01)
*H01L 23/52* (2006.01)
*H01L 29/40* (2006.01)
*H01L 21/768* (2006.01)
*H01L 23/532* (2006.01)

(52) U.S. Cl.
CPC .... *H01L 21/76849* (2013.01); *H01L 21/76898* (2013.01); *H01L 23/53238* (2013.01); *H01L 2924/0002* (2013.01); *H01L 2924/00014* (2013.01)

(58) Field of Classification Search
CPC .............. H01L 2924/00; H01L 2924/00014; H01L 2924/01074; H01L 2924/01027; H01L 2224/13144; H01L 2224/13147
See application file for complete search history.

(56) References Cited

U.S. PATENT DOCUMENTS

| | | | | |
|---|---|---|---|---|
| 6,130,157 | A  * | 10/2000 | Liu et al. | 438/669 |
| 2003/0183867 | A1 * | 10/2003 | Fricke et al. | 257/314 |
| 2007/0269978 | A1 * | 11/2007 | Shih et al. | 438/643 |
| 2012/0190191 | A1 | 7/2012 | Shih et al. | |

FOREIGN PATENT DOCUMENTS

| | | |
|---|---|---|
| KR | 1020050085833 | 8/2005 |
| KR | 100895865 | 5/2009 |
| WO | 2004061948 | 7/2004 |

* cited by examiner

*Primary Examiner* — Zandra Smith
*Assistant Examiner* — John M Parker
(74) *Attorney, Agent, or Firm* — Slater & Matsil, L.L.P.

(57) ABSTRACT

Presented herein is a method for electrolessly forming a metal cap in a via opening, comprising bringing a via into contact with metal solution, the via disposed in an opening in a substrate, and forming a metal cap in the opening and in contact with the via, the metal cap formed by an electroless chemical reaction. A metal solution may be applied to the via to form the metal cap. The metal solution may comprises at least cobalt and the cap may comprise at least cobalt, and may optionally further comprise tungsten, and wherein the forming the cap comprises forming the cap to further comprise at least tungsten. The metal solution may further comprise at least hypophosphite or dimethylaminoborane.

22 Claims, 4 Drawing Sheets

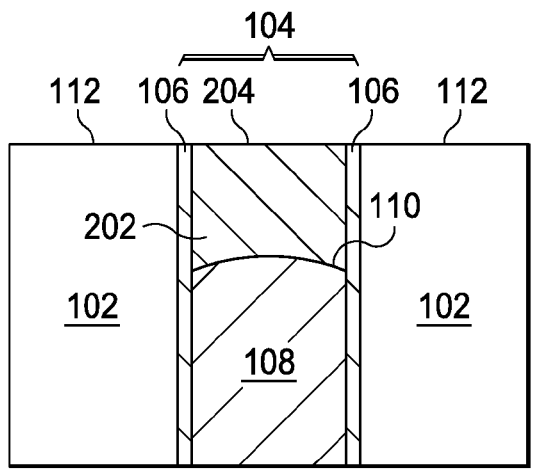 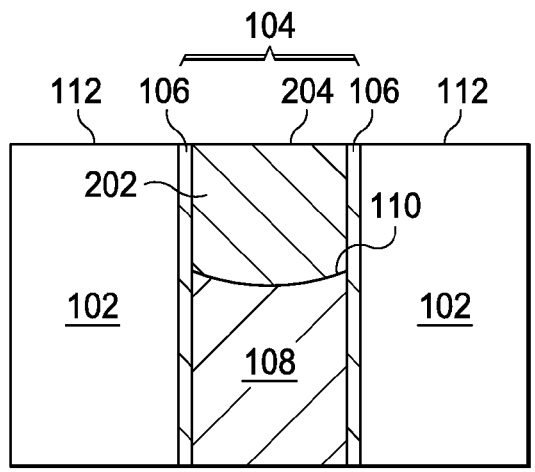
FIG. 7A     FIG. 7B
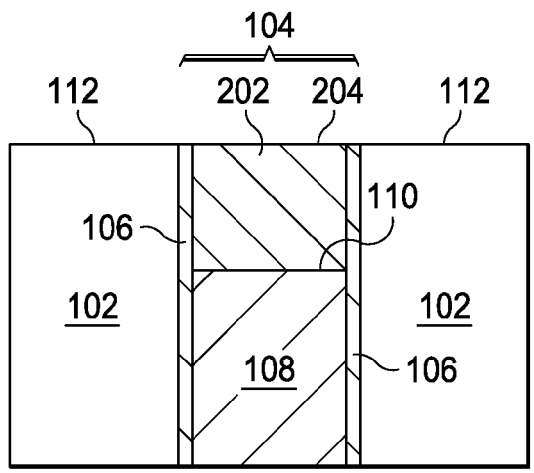
FIG. 7C

METAL CAP APPARATUS AND METHOD

CROSS-REFERENCE TO RELATED APPLICATIONS

This application claims the benefit of U.S. Provisional Application No. 61/778,307, filed on Mar. 12, 2013, entitled "Metal Cap Apparatus and Method" which application is hereby incorporated herein by reference.

BACKGROUND

As modern integrated circuits shrink in size, the associated features shrink in size as well. As transistors shrink, features such as through vias and other interconnect elements shrink in size as well. In many instances, various layers of circuit on chips, dies, in packages, on PCBs and other substrates are interconnected between various layers by way of vias. Vias can be formed in openings through a substrate filled with a conductive metal. Typically, the vias are connected to traces or other conductive structures to permit non-aligned contact points in different layers to be connected.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 7A-7C are cross-sectional diagrams illustrating shapes of via caps formed according to embodiments.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the illustrative embodiments are discussed in detail below. It should be appreciated, however, that the present disclosure provides many applicable concepts that can be embodied in a wide variety of specific contexts. The specific embodiments discussed are merely illustrative of specific ways to make and use the embodiments of the disclosure, and do not limit the scope of the disclosure.

The present disclosure is described with respect to embodiments in a specific context, namely forming metal caps on recessed features using an electroless chemical reaction, and in particular, forming metal caps on through vias. The embodiments of the disclosure may also be applied, however, to a variety of features, plating scenarios or other metal feature formation techniques. Hereinafter, various embodiments will be explained in detail with reference to the accompanying drawings.

Conductive features are commonly used in semiconductor device and packaging fabrication to connect active devices such as transistors, to provide interconnects or mounting pads for package-on-package mounting solder balls, or the like. In some instances, a metal via may be disposed through one or more dielectric layers in interlayer dielectrics (ILDs) or intermetal dielectrics (IMDs). In other instances, vias may be used through substrates or similar structures. Vias may be formed by electroplating, deposition in a damascene or masking processes, or by other techniques. Copper is a commonly used metal for vias and interconnects due to its cost, predictable properties, and adhesion to many different substrates. Other metals used in vias may include gold, aluminum, tungsten, cobalt, palladium, nickel, silver, compounds or alloys of the same, or other conductive materials.

In some instances, caps may be used to cover the surfaces of vias, particularly over vias, which may be prone to corrosion, contamination or surface imperfections arising from, for example, steps of the device or package fabrication process. Via caps may also be used to plate a dissimilar metal via to increase adhesion of subsequent layers or structures, or to alter the surface electrical properties of the via. For example, cobalt may be used to cap a copper via to provide resistance to corrosion and to prevent copper leaching into subsequent layers.

In an embodiment, a metal cap may be formed within the via opening by replacing a portion of the via metal, allowing the cap material to extend from the top of the via opening down into the via opening, preventing exposure of the via material, particularly at the top surface of the via.

Figure 1:
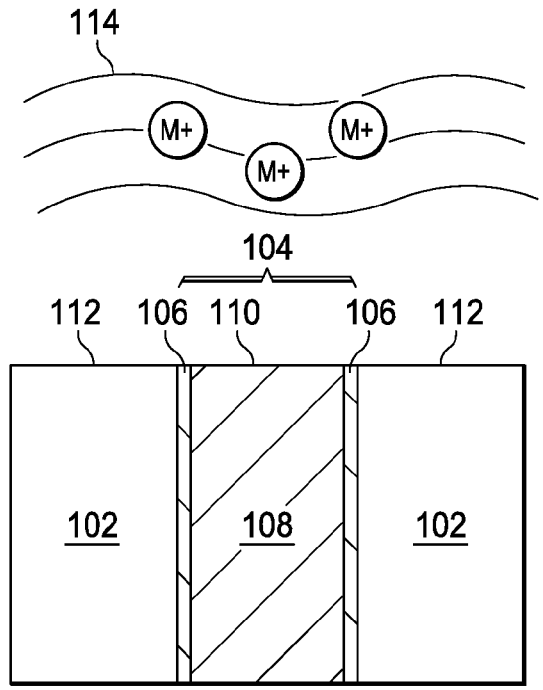
FIGS. 1-6 are cross-sectional diagrams of illustrating intermediate steps in a process for capping a via according to various embodiments.

FIG. 1 illustrates an initial via 108 structure for applying a cap according to an embodiment. In an embodiment, the substrate 102 may be a semiconductor such as silicon, or may be a dielectric such as a nitride, oxide or the like. Furthermore, the substrate 102 may be a redirection layer, IMD, ILD passivation layer, or any other nonconductive structure. The substrate 102 may have a via opening 104 formed therein. While the sidewalls of the via opening 104 are illustrated as being substantially linear and perpendicular to the top surface 112 of the substrate 102, the sidewalls may be at an angle greater or less than 90 degrees to the substrate 102 top surface 112, and may be curved, in linear sections, or otherwise non-linear. Additionally, while the via opening 104 of FIG. 1 is illustrated as extending through the substrate 102, the embodiments presented herein may be applied to a recess or opening extending partially through the substrate 102 as well.

A via 108 may be disposed within the via opening 104, and may have a via top surface 110 that extends to near the substrate top surface 112. In an embodiment, the via top surface 110 and the substrate top surface 112 may be substantially level, may optionally be substantially planar. The via opening 104 may have one or more liners 106 that may comprise a base layer, isolation layer or protective layers disposed on the sidewalls. For example, in an embodiment, the liner 106 may be a metal such as palladium, which may prevent a diffusion of a metal such as copper from diffusing from the via 108 into the substrate 102. The liner 106 may also, in an embodiment, have an isolation layer such as a high-k nitride or oxide to electrically isolate the via 108 from the substrate 102.

It has been discovered that forming a cap on the top surface 110 of the via 108, with the cap lying on or above the top surface 112 of the substrate 102 may lead to undesirable effects. These effects may be particularly prominent where the overlying cap is formed using chemical vapor deposition (CVD) processes. An overlying cap, for example, may cause via 108 material leakage, current shorts across adjacent vias 108 and non-uniform caps. For example, a deposited cap may be imperfectly formed, and may not completely cover the via 108 at the edges of the via. In such a structure, the surface 110 of the via 108 may be exposed, permitting diffusion of via 108 material into an overlying dielectric layer. Additionally, CVD deposition of metal cap layers over the via 108 may result in residual material deposited between the caps of adjacent vias 108, resulting in shorts across the vias 108.

An embodiment may comprise a via 108 with a metal cap layer formed inside the via opening 104. An electroless chemical process such as electroless deposition or metal exchange process may provide for a more uniform deposition coating than an electroplating process by avoiding current density uniformity problems. In an embodiment, the metal cap may be formed using an electroless metal exchange process. In such a process, an upper portion of the via 108 metal may be replaced with a second metal without the use of a voltage or outside electrical power source. In such an embodiment, the substrate 102 and via 108 may be disposed in a metal solution 114 having ionic metal (M⁺) dissolved therein. A metal via 108 comprising a metal having a lower reduction potential will oxidize in a reduction-oxidation reaction when exposed to an ionic metal having a higher reduction potential. The ionic metal will undergo reduction and exchanging places in the via 108 with the original via 108 metal. In an embodiment, a copper via 108 may be capped with a different metal such as gold, platinum, silver or ruthenium, each of which has a reduction potential greater than that of copper. It should be noted that other metals, alloys or materials having higher reduction potentials may also be used. Thus, the metal solution 114 may have one or more ionic metals (M⁺) dissolved therein, with the ionic metal (M⁺) having a reduction potential greater than the material of the metal via 108. Equations 1-5 illustrate the reduction potentials of materials that may be used in embodiments:

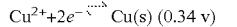
$$Cu^{2+}+2e^- \rightleftharpoons Cu(s)\ (0.34\ v) \qquad 1)$$

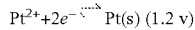
$$Pt^{2+}+2e^- \rightleftharpoons Pt(s)\ (1.2\ v) \qquad 2)$$

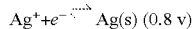
$$Ag^++e^- \rightleftharpoons Ag(s)\ (0.8\ v) \qquad 3)$$

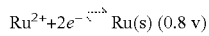
$$Ru^{2+}+2e^- \rightleftharpoons Ru(s)\ (0.8\ v) \qquad 4)$$

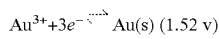
$$Au^{3+}+3e^- \rightleftharpoons Au(s)\ (1.52\ v) \qquad 5)$$

Figure 2:
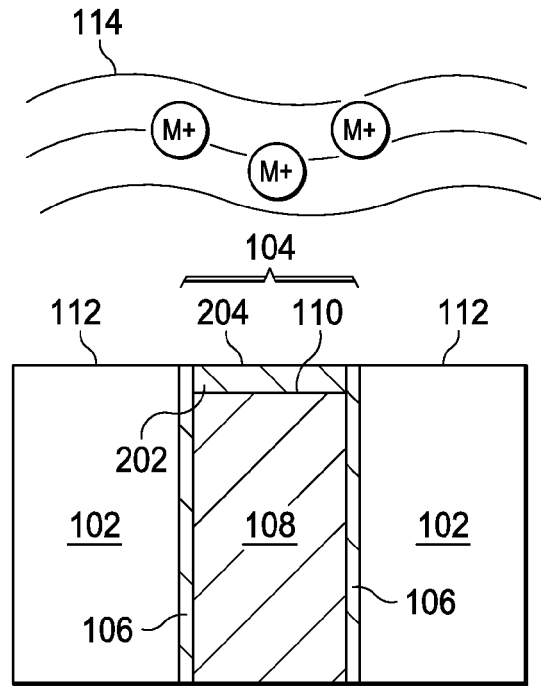

FIG. 2 illustrates a via structure having an initial cap 202 layer formed thereon according to an embodiment. The cap 202 is formed through a metal exchange process, with the ionic metal (M⁺) displacing material of the via 108. The via 108 metal becomes a second ionic metal (N⁺) in the metal solution 114. The cap 202 has a top cap surface 204 that is about the same level as the original via top surface 110 (in FIG. 1), with the metal cap surface 110 moving down as the cap 202 displaces the material of the via 108. While the cap 202 is illustrated as being a distinct layer separate from the via 108, it should be understood that in an embodiment, the cap layer may be diffused into the via material, the top surface 10 of the via 108 indicating a transition between a majority via 108 metal and a majority cap 202 metal.

Additionally, the liner 106 in the via opening 104 may be formed of a material that would not react with the metal ions (M⁺) of the metal solution 114. For example, the liner 106 may be a high-k dielectric that would not react in a reduction-oxidation reaction with the metal ion (M⁺) of the metal solution 114. In another embodiment, the liner 106 may be a metal that has a higher reduction potential such the material in the metal solution 114 would not react in a reduction-oxidation reaction with the metal ion (M⁺) of the metal solution 114. For example a via 108 may be copper, the liner 106 may be palladium (See Eq. 6), and the metal ion (M⁺) may be silver. The reduction potential of palladium is illustrated in equation 6, below:

$$Pe^{2+}2e^- \rightleftharpoons Pd(s)\ (0.915\ v) \qquad (6)$$

The reduction potential of silver is less than palladium, but greater than copper, so the silver would reduce the copper and not the palladium, resulting in the palladium liner 106 remaining intact while a silver cap 202 is formed on the copper via 108. In an embodiment, the cap formation process may be achieved as an electroless process, as the metal exchange reaction described above occurs without application of voltage.

Figure 3:
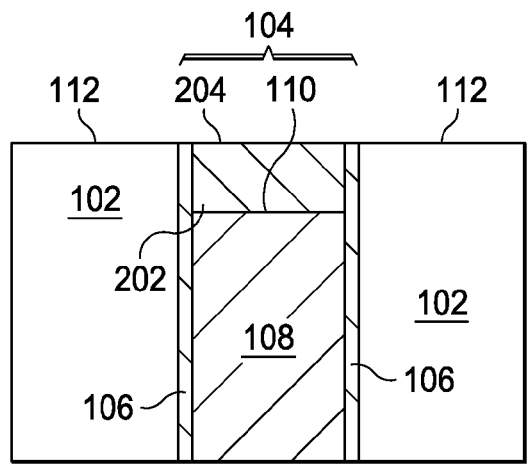

FIG. 3 illustrates a via structure having a cap 202 layer formed thereon according to an embodiment. The top surface 110 of the via 108 migrates down as the cap 202 grows, causing the cap 202 to grow thicker while the cap top surface 204 remains about level or planar with the top surface of the substrate 102. The thickness of the cap 202 may be controlled by limiting the duration of the period that the metal solution 114 is in contact with the via 108 and cap 202. In an embodiment, the cap 202 may be formed to a thickness of about 20 nm or less.

The shape of the via top surface 110 may be controlled by introducing one or more materials into the metal solution 114. FIG. 7A shows a domed via top surface 110, FIG. 7B shows a cupped via top surface 110, and FIG. 7C shows a flat via top surface 110. The different shapes of the via top surface 110 underneath the cap 202 may be controlled by introducing a material such as carbon, oxygen, hydrogen, nitrogen, sulfur, chlorine or bromine into the metal solution 114. For example, a metal solution 114 with carbon may be used to control the shape of the via top surface 110. In such an embodiment, a carbon concentration higher than the exchanged metal from the via 108 present in the metal solution may result in a cupped via top surface 100, as shown in FIG. 7A. A metal solution with no carbon may result in a cupped via top surface 110 is formed, as shown in FIG. 7B. A carbon concentration less than the exchanged metal from the via 108 present in the metal solution may result in the flat via top surface 110, as shown in FIG. 7C.

Figure 4:
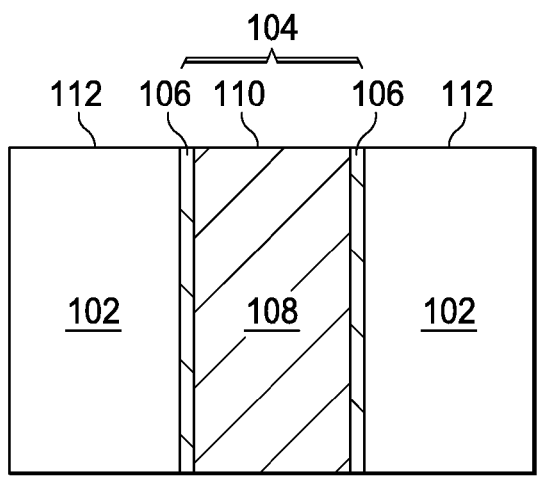

FIG. 4 illustrates an initial via 108 structure for applying a cap according to another embodiment. The substrate 102, via 108 and optional liner 106 may be formed using similar processes and/or materials as discussed above. In such an embodiment, the via 108 may be etched back and a cap 202 formed by way of an electroless chemical deposition as discussed in greater detail below. A substrate 102 with a via 104 and optional liner 106 may be provided.

Figure 5:
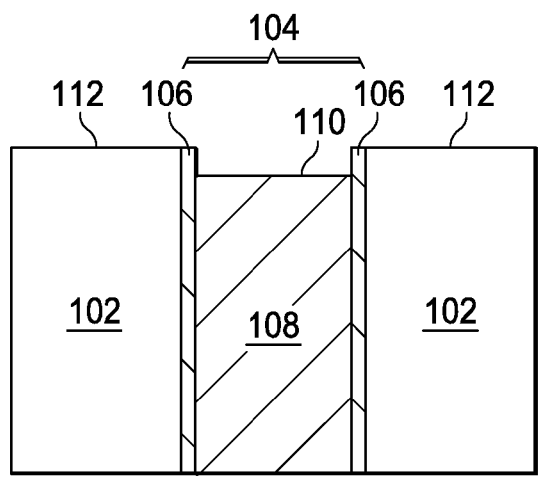

FIG. 5 illustrates etchback of the via 108 according to an embodiment. The via 108 may, in an embodiment, be etched to a predetermined depth by, for example, a selective etch. The thickness of the cap 202 may be controlled by etching the via 108 back to a depth equal to a predetermined cap thickness. In one embodiment, the via 108 may be etched back by about 20 nm or less. The via top surface 110 may be etched to form a shape as shown in FIGS. 7A-7C. The etchant used to etch back the via 108 may be adjusted to result in a desired via top surface 110. For example, in an embodiment, the via 108 may be etched back with an etchant such as $CH_4$, $C_4F_8$, $CHF_3$, $CH_2F_2$ or $Cl_2$. The ratio of carbon to chlorine or fluorine may be used to control the shape of the top surface 110. For example, the domed via top surface 110, as shown in FIG. 7A may be formed by etching with an etchant having a greater percentage of carbon than of chlorine or fluorine. The cupped via top surface 110, as shown in FIG. 7B may be formed by etching with a chlorine or fluorine based etchant having no carbon. The flat via top surface 110, as shown in FIG. 7C may be formed by etching with an etchant having a lower percentage of carbon than of chlorine or fluorine.

Figure 6:
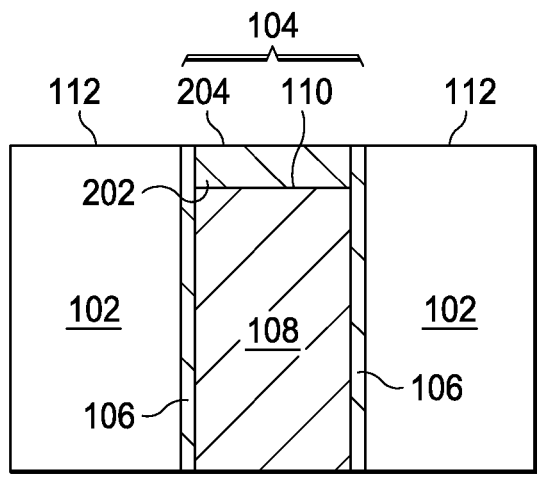

FIG. 6 illustrates a cross sectional view of deposition of a cap 202 over a via 108 in a via opening 104 according to an embodiment. In an embodiment a cap 202 may be deposited, for example, using a metal solution comprising hypophosphite or dimethylaminoborane (DMAB). In such an embodiment, a hypophosphite/metal solution or DMAB/metal solution may be applied to an etched via 108 to form the cap 202 in the recess created by etching back the via 108. Multiple metal materials may be deposited using such techniques, and particularly, metals having a lower reduction potential than the via 108 material. For example, hypophosphite may be used with to form a cobalt and tungsten cap 202 according to equations 7-9, below:

$$\text{Deposit Co: } Co^{2+}+2H_2PO_2^-+4OH^-=Co_{(s)}+2HPO_3^{2-}+H_2+2H_2O \quad (7)$$

$$\text{Co-Deposit P: } 4H_2PO_2^-=2P_{(s)}+2HPO_3^{2-}+H_2+2H_2O \quad (8)$$

$$\text{Co-Deposit W: } WO_2^{2+}+6H_2PO_2^-+2OH^-+2H_2O=W_{(s)}+6H_2PO_3^-+3H_2 \quad (9)$$

In another embodiment, DMAB may be used to form a cobalt and tungsten cap 202 according to equations 10-12, below:

$$\text{Deposit Co: } 3Co^{2+}+2(CH_3)_2NH:BH_3+6OH^-=3Co_{(s)}+2B(OH)_3+3H_2+2(CH_3)_2NH \quad (10)$$

$$\text{Co-Deposit B: } 4(CH_3)_2NH:BH_3+6H_2O=2B_{(s)}+2B(OH)_3+9H_2+4(CH_3)_2NH \quad (11)$$

$$\text{Co-Deposit W: } WO_2^{2+}+4(CH_3)_2NH:BH_3+4OH^-+2H_2O=W_{(s)}+2B(OH)_3+2H_2+2(CH_3)_2NH \quad (12)$$

Hypophosphite or DMAB may be used to facilitate the reaction, creating an autocatalytic reduction-oxidation reaction, with the surface of the via 108 attracting the plating to fill the recess etched in the via 108. Phosphorus or boron may be co-deposited with cobalt and tungsten in such embodiment as a byproduct of the reaction. However, other co-deposit materials may include carbon, oxygen, hydrogen, nitrogen sulfur, chlorine or bromine, depending on the materials deposited and the additives in the metal plating solution.

Figure 8:
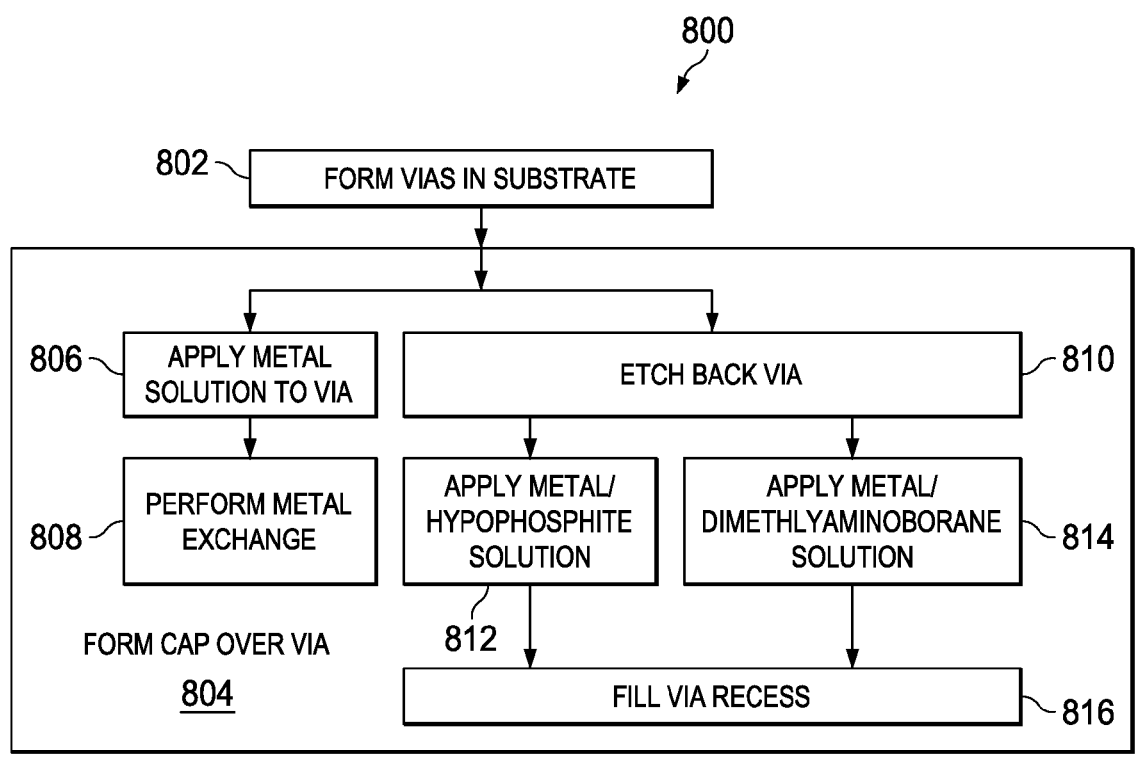
FIG. 8 is a flow diagram illustrating a method of forming a via cap according to embodiments.

FIG. 8 is a flow diagram illustrating a method 800 of forming an electroless via cap 202 according to embodiments. One or more vias 108 may be formed in the substrate 102. The vias may be formed in block 802 by electroplating, masking and deposition using a technique such as CVD, or another suitable technique. A cap 202 may be formed over the via 108, and within the via opening 104, in block 804. The cap 202 may optionally be applied in block 804 optionally by the metal exchange process or by the etching/electroless deposition process. The metal exchange process may be performed by applying a metal solution 114 to the via 202 in block 806. The metal exchange may be performed in block 808, retaining the metal solution 114 in contact with the via 108 and cap 202 until the cap 202 reaches a predetermined thickness. The etching/electroless deposition process may be performed by etching the via to a predetermined thickness in block 810. A metal/hypophosphite solution may be applied to the via 108 in block 812, or a metal/DMAB solution may be applied to the via 108 in block 814. The metal/hypophosphite or metal/DMAB solution may be retained in contact with the via and cap 202 until the recess formed by etching the via 108 is filled. In an embodiment, any excess cap 202 material may be planarized to bring the top surface 204 of the cap 202 to about the same level with the substrate stop surface 112, for example, by a CMP or the like.

Thus, according to an embodiment, a method of forming a metal layer may comprise bringing a via into contact with metal solution, the via disposed in an opening in a substrate, and forming a metal cap in the opening and in contact with the via, the metal cap formed by an electroless chemical reaction. The method may further comprise applying a metal solution to the via, with the metal solution forming the metal cap. The method may further comprise etching back the via below a top surface of the substrate prior to forming the metal cap. The metal solution may comprise at least cobalt and may further comprise tungsten. Forming the cap may comprise forming the cap to comprise at least cobalt, and optionally to further comprise tungsten. The metal solution may comprise at least hypophosphite or dimethylaminoborane.

Another embodiment of a method of forming a metal layer may comprise applying a metal solution to a via disposed in an opening in a substrate, the opening having a liner disposed on sidewalls of the opening, and the liner separating the substrate and the via. A metal cap may be formed in the opening and in contact with the via. The metal cap may be formed by a metal exchange reaction. The method may comprise bringing the metal solution into contact with a surface of the via that is about level with a top surface of the substrate. The metal solution may comprise a first metal, and the via may a second metal different from the first metal. The first metal may have a reduction potential greater than a reduction potential of the second metal. The first metal may be at least one of gold, silver, ruthenium and platinum.

An apparatus according to an embodiment may comprise a substrate having an opening disposed therein and extending from a first side into the substrate, a via disposed in the opening, the via comprising a first metal, and a cap disposed in the opening and covering a first surface of the via, the cap disposed between the first surface of the substrate and the via. The cap may comprise at least a first metal and the via may comprise at least a second metal different from the first metal. A liner may be disposed on a sidewall of the opening, the liner disposed between the via and the substrate.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a metal layer, comprising:
   selecting a concentration of carbon in a carbon-containing fluid based on a desired shape of a top surface of a via;
   bringing the via into contact with the carbon-containing fluid to form the top surface of the via having the desired shape, the via disposed in an opening in a substrate; and
   forming a metal cap in the opening and in contact with the via, the metal cap formed by an electroless chemical reaction, the metal cap overlying the top surface of the via.

2. The method of claim 1, further comprising applying a metal solution to the via, the metal solution forming the metal cap.

3. The method of claim 2, wherein the carbon-containing fluid etches back the via below a top surface of the substrate prior to forming the metal cap.

4. The method of claim 3, wherein the metal solution comprises at least cobalt, and wherein the forming the cap comprises forming the cap to comprise at least cobalt.

5. The method of claim 4, wherein the metal solution further comprises at least tungsten, and wherein the forming the cap comprises forming the cap to further comprise at least tungsten.

6. The method of claim 4, wherein the metal solution further comprises at least hypophosphite.

7. The method of claim 4, wherein the metal solution further comprises at least dimethylaminoborane.

8. The method of claim 2, wherein the via is copper.

9. The method of claim 2, wherein the metal solution comprises a first metal, and wherein the via comprises a second metal different from the first metal.

10. The method of claim 1, wherein the concentration of carbon in the carbon-containing fluid is selected relative to a material of the via.

11. The method of claim 1, wherein the concentration of carbon in the carbon-containing fluid is selected relative to chlorine or fluorine.

12. A method of forming a metal layer, comprising:
   providing a substrate having an opening disposed therein and extending from a first surface of the substrate into the substrate;
   applying a metal solution to a via disposed in an opening in a substrate, the opening having a liner disposed on sidewalls of the opening, the liner separating the substrate and the via; and
   forming a metal cap in the opening and in contact with the via, the metal cap formed by a metal exchange reaction in which a first metal of the metal solution displaces a second metal of the via, the second metal being displaced from the via into the metal solution.

13. The method of claim 12, wherein applying the metal solution to the via comprises at least bringing the metal solution into contact with a surface of the via that is about level with a top surface of the substrate.

14. The method of claim 13, wherein the second metal is different from the first metal, and wherein the first metal has a reduction potential greater than a reduction potential of the second metal.

15. The method of claim 14, wherein the first metal is at least one of gold, silver, ruthenium and platinum.

16. The method of claim 15, wherein the the second metal is copper.

17. The method of claim 12, wherein forming the metal cap comprises forming the top surface of the via to have a predetermined shape, the predetermined shape determined by the amount of a first material in the metal solution, wherein the first material is carbon, oxygen, hydrogen, nitrogen, sulfur, chlorine or bromine.

18. The method of claim 17, wherein the first material is carbon, and wherein the concentration of carbon in the metal solution is greater than the concentration of the displaced second metal of the via in the metal solution.

19. The method of claim 17, wherein the forming the top surface to a predetermined shape comprised forming a domed top surface of the via.

20. A method of forming a metal layer, comprising:
   forming a via in a dielectric layer the via including an opening in a dielectric layer, a liner lining the opening, and a conductive metal filling the opening;
   etching back a top surface of the conductive metal using an etchant to form a recessed top surface below a top surface of the dielectric layer and having a predetermined cross-sectional shape; and
   exposing the recessed top surface to a metal solution to grow a cap layer on the recessed surface, wherein the predetermined cross-sectional shape of the recessed surface is controlled by a concentration of carbon in the etchant relative to a concentration of chlorine or fluorine in the etchant.

21. The method of claim 20, wherein the metal solution is selected from a group consisting of a hypophosphite/metal solution, a dimethylaminoborane/metal solution, and combinations thereof.

22. The method of claim 20, wherein the predetermined cross-sectional shape is dome shaped, and wherein the concentration of carbon in the etchant is greater than the concentration of chlorine or fluorine in the etchant.

* * * * *